United States Patent
Remington

(10) Patent No.: US 9,490,031 B2
(45) Date of Patent: Nov. 8, 2016

(54) HIGH-SPEED ADDRESS FAULT DETECTION USING SPLIT ADDRESS ROM

(71) Applicant: Scott I. Remington, Austin, TX (US)

(72) Inventor: Scott I. Remington, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 5 days.

(21) Appl. No.: 14/190,595

(22) Filed: Feb. 26, 2014

(65) Prior Publication Data

US 2015/0243368 A1   Aug. 27, 2015

(51) Int. Cl.
| | | |
|---|---|---|
| *G11C 29/00* | (2006.01) | |
| *G11C 29/02* | (2006.01) | |
| *G11C 17/00* | (2006.01) | |
| *G11C 29/12* | (2006.01) | |

(52) U.S. Cl.
CPC ............ *G11C 29/024* (2013.01); *G11C 17/00* (2013.01); *G11C 2029/1202* (2013.01)

(58) Field of Classification Search
CPC .................................................. G11C 29/024
USPC ........................................................ 365/200
See application file for complete search history.

(56) References Cited

U.S. PATENT DOCUMENTS

| | | |
|---|---|---|
| 5,371,712 A | 12/1994 | Oguchi et al. |
| 5,963,489 A | 10/1999 | Kirihata et al. |
| 6,037,799 A | 3/2000 | McClure |
| 6,757,854 B1 | 6/2004 | Zhao et al. |
| 6,816,396 B2 | 11/2004 | Chai et al. |
| 7,679,185 B2 | 3/2010 | Zimmerman et al. |
| 7,727,185 B2* | 6/2010 | Weitzner .......... A61B 17/12045 604/164.12 |
| 7,729,185 B2 | 6/2010 | Shirur et al. |
| 8,379,468 B2* | 2/2013 | Ramaraju ............ G11C 29/024 365/200 |

(Continued)

FOREIGN PATENT DOCUMENTS

EP      1049103 A1      11/2000

OTHER PUBLICATIONS

ST, CMOSM40_ST_SPHS_LL, User Manual, Single Port High Speed Static RAM Designed in 40nm NVM Technology, User Manual Revision 1.1, Mar. 7, 2013, 45 pgs.

(Continued)

*Primary Examiner* — Min Huang

(57) ABSTRACT

High-speed address fault detection is described that uses a split address ROM (read only memory) for address fault detection in split array memory systems. In one aspect, a disclosed embodiment includes separate arrays of memory cells having a plurality of wordlines and being configured to be accessed based upon a wordline address. Two or more separate address ROMs are also provided with each address ROM being associated with a different one of the separate arrays and being configured to provide outputs based upon only a portion of the wordline address. Detection logic is coupled to the outputs from the address ROMs and is configured to provide one or more fault indicator outputs to indicate whether an address fault associated with the wordline address has occurred. The outputs form the address ROMs can also be used for wordline continuity fault detection. Other embodiments are also described.

17 Claims, 6 Drawing Sheets

(56) References Cited

U.S. PATENT DOCUMENTS

| | | | |
|---|---|---|---|
| 8,630,138 B2 | 1/2014 | Kobayashi | |
| 8,687,444 B2 | 4/2014 | Ide et al. | |
| 2004/0205318 A1* | 10/2004 | Kimelman | G06F 9/30181 |
| | | | 711/202 |
| 2006/0268635 A1* | 11/2006 | Murakoshi | G11C 16/3445 |
| | | | 365/200 |
| 2009/0037782 A1 | 2/2009 | Hughes | |
| 2009/0201709 A1* | 8/2009 | Inoue | G11C 15/04 |
| | | | 365/49.17 |
| 2010/0199056 A1* | 8/2010 | Zitlaw | G11C 16/10 |
| | | | 711/166 |
| 2011/0307769 A1 | 12/2011 | Ramaraju et al. | |
| 2016/0027529 A1* | 1/2016 | Hoefler | G11C 29/02 |
| | | | 365/154 |

OTHER PUBLICATIONS

Yao, X., et al., "Single Event Transient Mitigation in Cache Memory using Transient Error Checking Circuits", IEEE, Custom Integrated Circuits Conference, pp. 1-4 (2010).

Hoefler, et al., "Address Fault Detection Circuit," U.S. Appl. No. 14/339,049, filed Jul. 23, 2014, 47 pages.

U.S. Appl. No. 14/339,049, Hoefler, A., "Address Fault Detection Circuit", Office Action—Non-Final Rejection, mailed Aug. 3, 2015.

U.S. Appl. No. 14/339,049, Hoefler, A., "Address Fault Detection Circuit", Office Action—Notice of Allowance, mailed Nov. 25, 2015.

U.S. Appl. No. 13/169,397, Ramaraju, R. "Word Line Fault Detection", Office Action—Notice of Allowance, mailed Oct. 23, 2012.

* cited by examiner

HIGH-SPEED ADDRESS FAULT DETECTION USING SPLIT ADDRESS ROM

TECHNICAL FIELD

This technical field relates to address fault detection for integrated circuit memories.

BACKGROUND

Integrated circuits may fail in a variety of ways, and with memories continuing to be more common as at least a portion of integrated circuits, failures in memories are having a bigger impact. One of the failures in memories relates to addressing errors related to wordlines.

U.S. Pat. No. 8,379,468 describes embodiments that detect an address fault where no wordline is enabled when the memory is intended to be accessed. Detection for this type of failure is indicated by a wordline on indicator signal that indicates whether at least one wordline has been enabled. This patent also describes embodiments that detect an address fault where more than one wordline is enabled in the same array or sub-array. The signal that indicates this type of fault is a multi-wordline on fault indicator signal. As described in this patent, although it is preferable that address fault errors do not occur, it is useful to detect address faults and provide a fault indication as quickly as possible.

FIG. 1 (Prior Art) is a block diagram from U.S. Pat. No. 8,379,468 providing a memory system 10 including an address ROM (read only memory) 20 and detection logic 22 that are used to generate a wordline on indicator and a multi-wordline on indicator. Memory system 10 includes an address decoder 11 coupled to receive an address, a wordline driver 12 coupled to address decoder 11, column logic 16, and control logic 14 coupled to address decoder 11, wordline driver 12, and column logic 16. The memory system 10 also includes a data array 18 of memory cells coupled to wordline driver 12, control logic 14, and column logic 16. The address ROM 20 is coupled to data array 18, and the detection logic 22 is coupled to address ROM 20. Control logic 14 receives a write/read (WR/RD) signal, a clock (CLK), and an enable signal. Column logic 16 inputs data in and outputs data out. Column logic 16 may also receive address information. Detection logic 22 receives clock (CLK) and outputs the wordline on indicator and the multi-wordline on indicator.

In operation, as described in U.S. Pat. No. 8,379,468, control logic 14 receives the enable signal, and address decoder 11 responds to the address as timed by the clock (CLK) to select a wordline in data array 18. Wordline driver 12 enables the selected wordline. When a wordline is enabled, it is considered on. When write/read signal (WR/RD) is for a write, data in is written into memory cells along the selected wordline by column logic 16. When signal WR/RD is for a read, column logic outputs data out from the memory cells along the enabled wordline. Address ROM 20, being coupled to the wordlines of data array 18, detects the presence or absence of signals on the wordlines as further described in U.S. Pat. No. 8,379,468, and couples that information to detection logic 22. Detection logic 22 interprets the information and provides the wordline on indicator and multi-wordline on indicator accordingly.

While the embodiments described in U.S. Pat. No. 8,379,468 are effective solutions for detecting wordline on and multi-wordline on address faults, there is still a need for additional solutions for the rapid detection of address faults in memory array systems.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale FIG. 1 (Prior Art) is a block diagram of a memory system that includes a wordline fault detector that provides wordline on and multi-wordline on fault indicators.

DETAILED DESCRIPTION

Embodiments for high-speed address fault detection using a split address ROM (read only memory) are disclosed for address fault detection in split array memory systems. In one aspect, a disclosed embodiment includes two or more separate arrays of memory cells having a plurality of wordlines and being configured to be accessed based upon a wordline address. Two or more separate address ROMs (read only memories) are also provided with each address ROM being associated with a different one of the separate arrays of memory cells and being configured to generate outputs based upon only a portion of the wordline address. Further, detection logic is coupled to the outputs from the address ROMs and is configured to provide one or more fault indicator outputs indicating an address fault associated with the wordline address. The outputs form the address ROMs can also be used for wordline continuity fault detection. Different features and variations can be implemented, as desired, and related or modified systems and methods can be utilized, as well.

Figure 1:
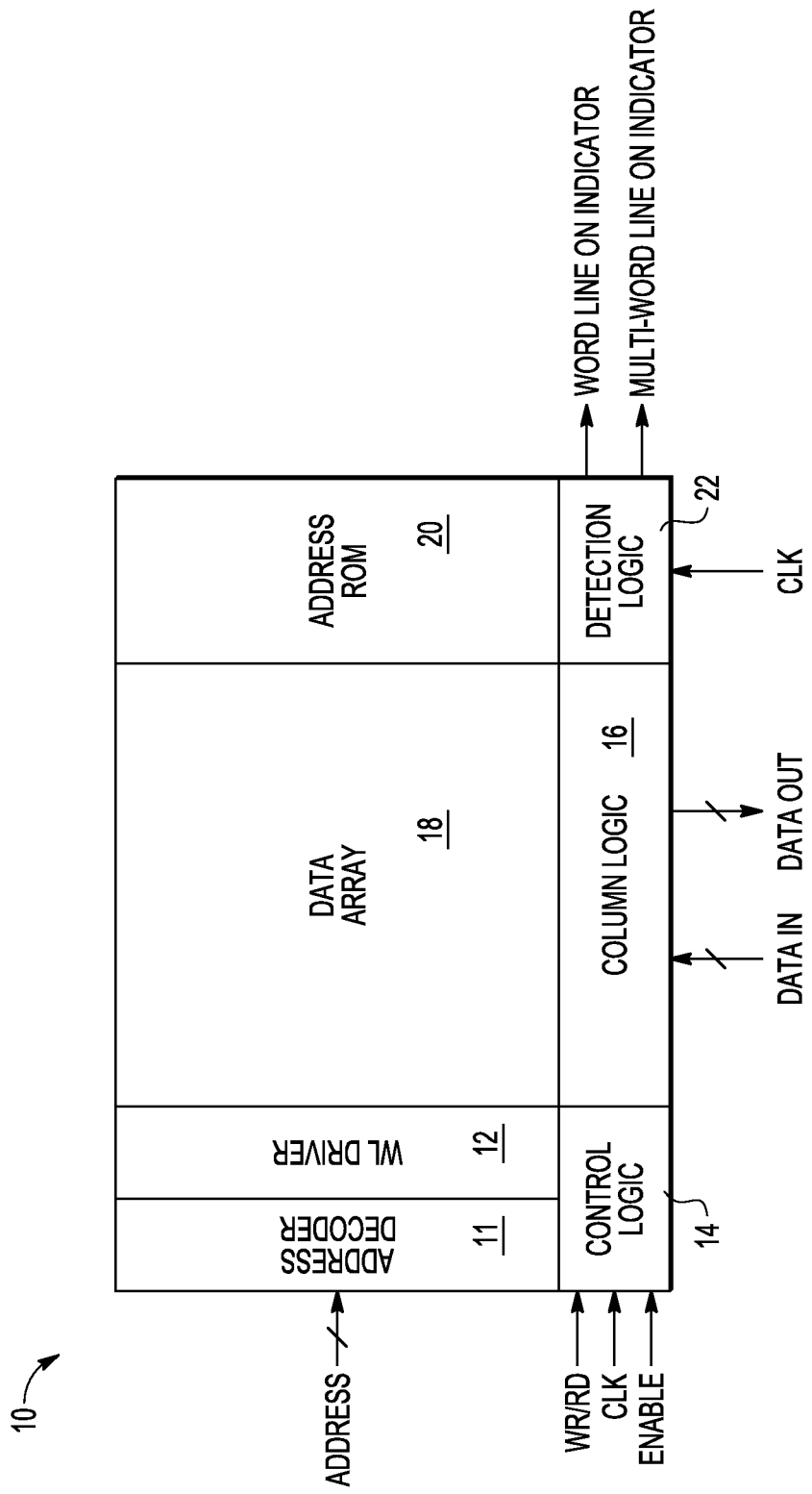
Figure 2A:
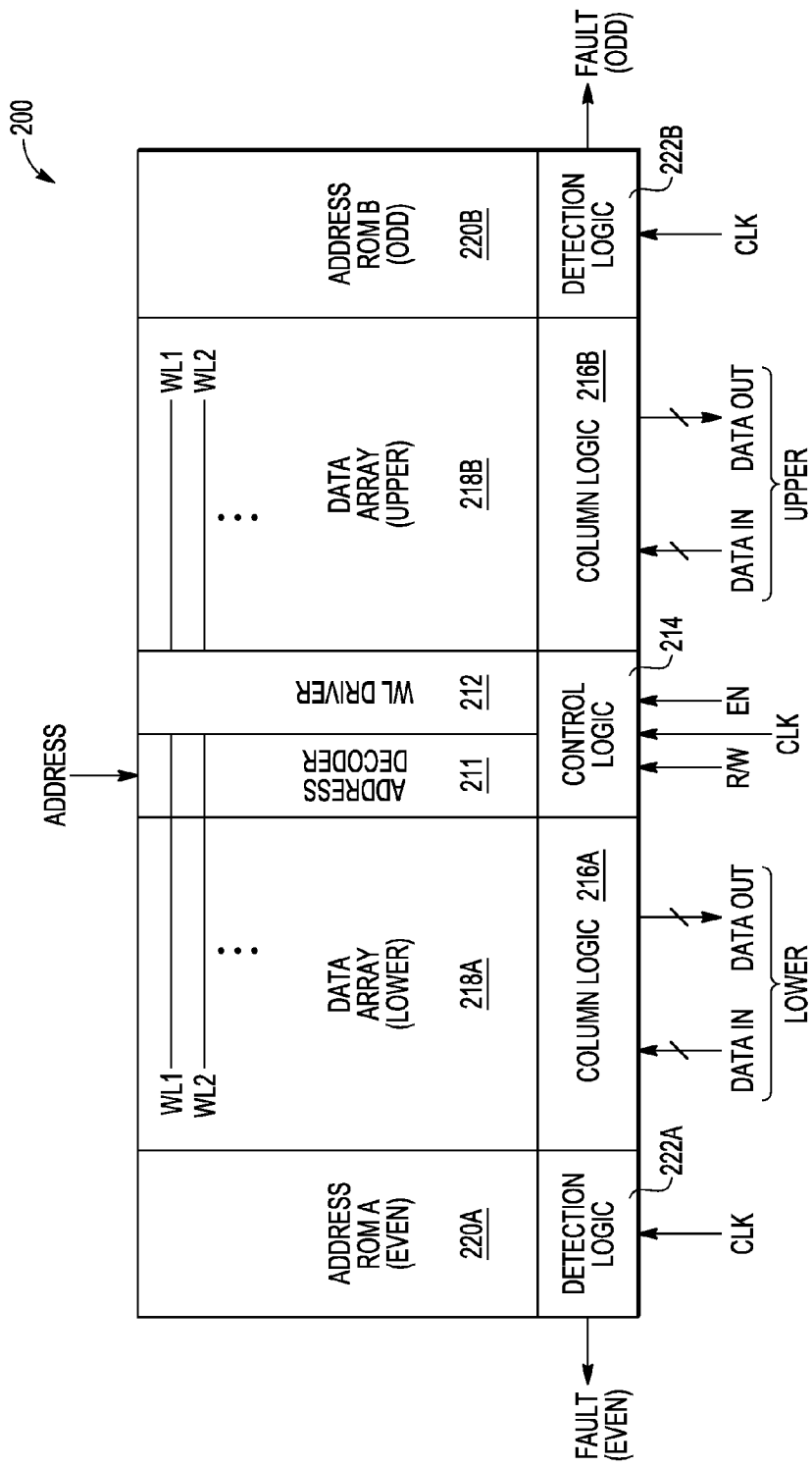
FIGS. 2A-B are block diagrams of split array memory systems that include address fault detection using a split address ROM (read only memory) and associated detection logic with one and multiple wordline drivers, respectively.

FIG. 2A is a block diagram of a split array memory system 200 that includes address fault detection using a split address ROM and associated detection logic. In contrast with FIG. 1 (Prior Art), the memory array is split into data array 218A and data array 218B, and the address ROM is split into two portions 220A/B that are positioned on either side of the split array and are connected to the wordlines WL1, WL2 . . . within the memory system 200. Data array 218A holds lower half of bits for data reads and/or writes to the memory system 200, and data array 218B holds upper half of bits for data reads and/or writes to the memory system 200. Similar to FIG. 1 (Prior Art), control logic 214 receives clock (CLK), a read/write (R/W) control signal, and an enable (EN) signal. The address decoder 211 receives an address that includes a wordline address and provides a decoded wordline address to the wordline (WL) driver 212. Based upon the decoded address, the wordline driver 212 selects and drives a wordline within the data array 218A and within the data array 218B. It is also noted that multiple wordline drivers could also be used as described with respect to FIG. 2B below. The column logic 216A receives data in for the lower half bits during writes and provides data out for the lower half bits during reads, and the column logic 216B receives data in for the upper half bits during writes and provides data out for the upper half bits during reads. The upper and lower bits are combined to form the data words being read from or written to the memory system 200.

In contrast with FIG. 1 (Prior Art), memory system 200 includes multiple address ROMs 220A/220B that are used for address fault detection, and these address ROMs 220A/220B are split such that only a portion of the total wordline address bits are included within each address ROM. For example, where the total number of wordline address bits are N bits from A0 to A(N−1) with "N" being an integer, address ROMA 220A can be configured to include M of the bits (e.g., even address bits) of the wordline address, and address ROMB 220B can then be configured to include N-M of the bits (e.g., odd address bits) of the wordline address. As one example, where a 7-bit address is used to select one of 128 wordlines within data arrays 218A/218B, address ROMA 220A can include four ROM address bits (A0, A2, A4, A6) for the even bits of the wordline address, and address ROMB 220B can include three ROM address bits (A1, A3, A5) for the odd bits of the wordline address. The detection logic 222A receives the ROM address bits (e.g., even address bits) from address ROMA 220A and outputs an address fault indicator (FAULT) that indicates whether or not an address fault has been detected. The detection logic 222B receives the ROM address bits (e.g., odd address bits) from address ROMB 220B and outputs an address fault indicator (FAULT) that indicates whether or not an address fault has been detected. These fault indicator signals can be combined to provide a single fault output indicator from the memory system 200, as described further below. The detection logic blocks 222A/222B can also receive the clock (CLK).

The split address ROMs 220A/B provide rapid detection of address faults while also detecting wordline continuity faults across both sides of the split memory array. By placing the address ROMA 220A having ROM bits for a portion of the wordline address on the opposite side of array 218A from the wordline driver 212, the continuity of wordlines (WL1, WL2 . . . ) extending across the array 218A can be detected. Similarly, by placing the address ROMB 220B having ROM bits for another portion of the wordline address on the opposite side of array 218B from the wordline driver 212, the continuity of wordlines (WL1, WL2 . . . ) extending across the array 218B can be detected. As such, by splitting the address ROM and placing portions on either side of a split memory array, continuity faults for the wordlines across both halves of the split array can be detected in addition to address faults. It is noted that continuity faults within the conductive material used for the wordlines will in effect cause an address fault as the drive voltage for a selected wordline will fail to reach the address ROM due to the continuity failure in the wordline. It is also noted that if the address ROM were placed on only one side of the array such as done in FIG. 1 (Prior Art), there would be no way of determining this wordline continuity for the other side of the array. It is noted that variations could also be implemented while still utilizing the split address ROMs described herein.

Figure 2B:
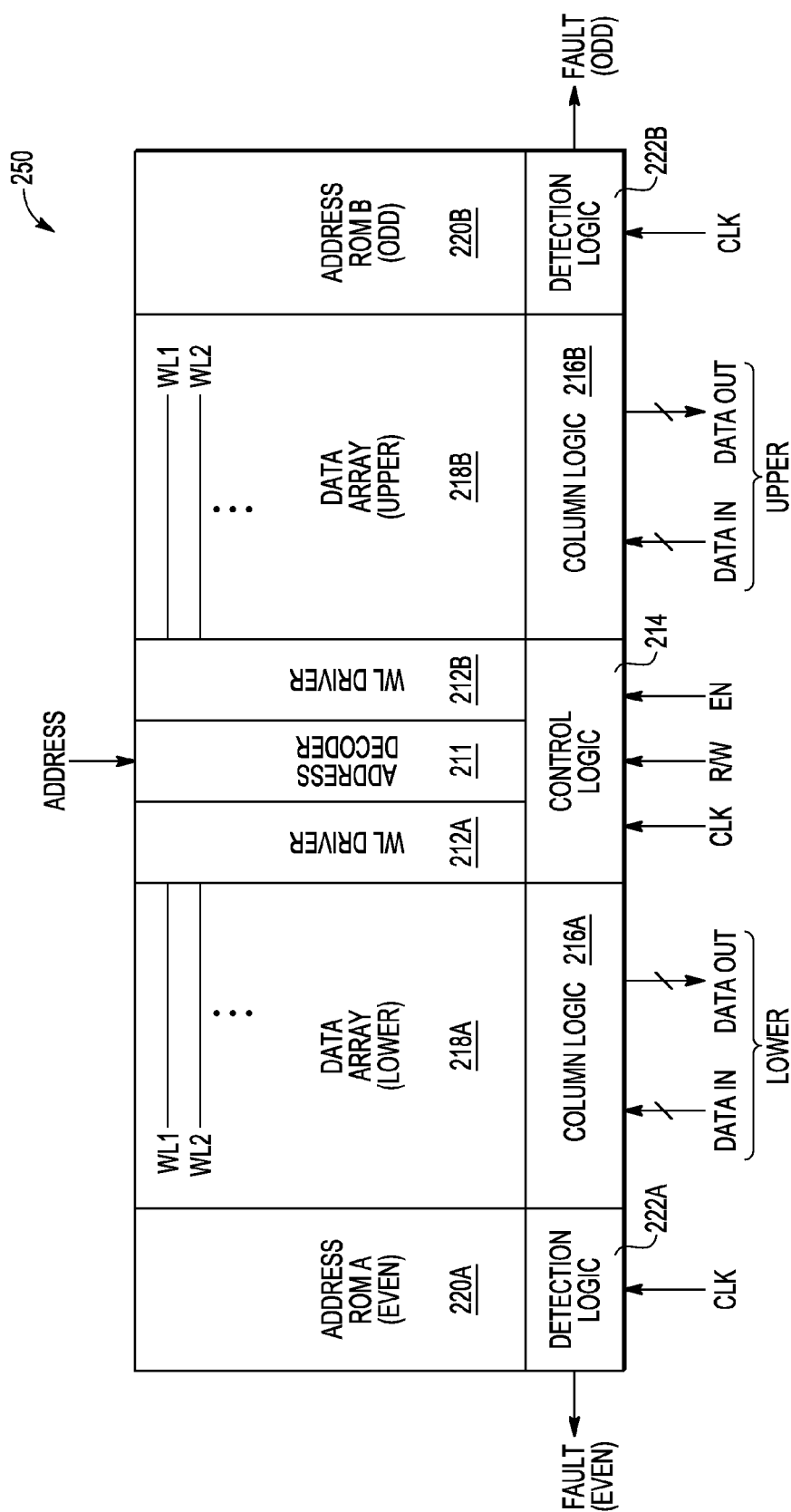

FIG. 2B is a block diagram of a split array memory system 250 that includes two wordline drivers 212A and 212B on either side of the address decoder 211. Based upon a decoded address from address decoder 211, the wordline driver 212A selects and drives a wordline within the data array 218A. Similarly, based upon a decoded address from address decoder 211, the wordline driver 212B selects and drives a wordline within the data array 218B. For this embodiment, it is also noted that all address decode occurs within address decoder 211 to avoid a circumstance where one half wordline is selected on one side and two half wordlines are selected on the other side. With embodiment 200 of FIG. 2A, this result would not take place as the wordline driver 212 drives both sides of the split array. In other respects, embodiment 250 operates as described above for embodiment 200. It is again noted that other variations could also be implemented while still utilizing the split address ROMs described herein.

Figure 3:
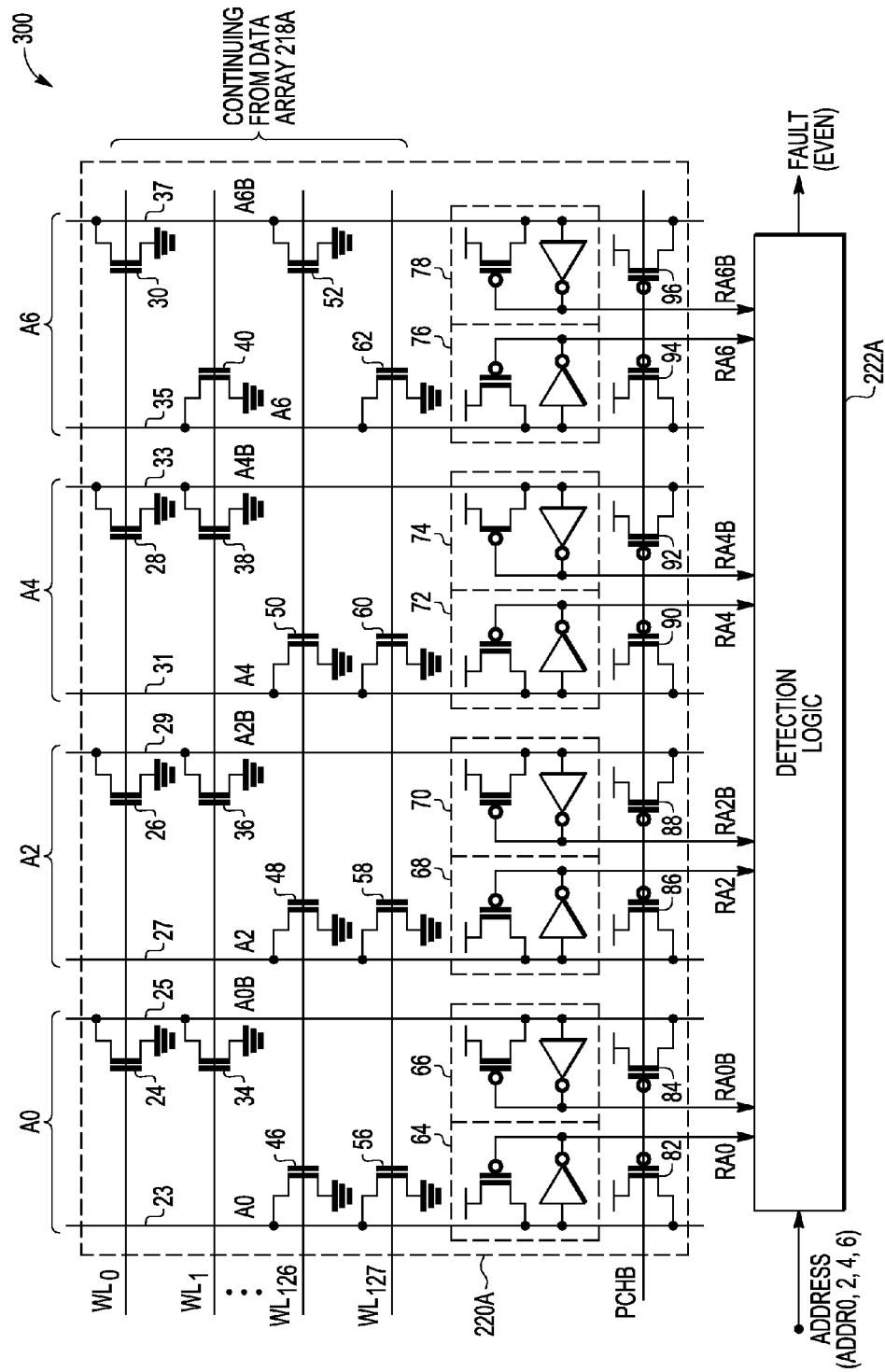
FIG. 3 is a circuit diagram of an example embodiment for one address ROM as part of a split address ROM that is configured to handle a portion of a wordline address.

FIG. 3 is a circuit diagram of an example embodiment 300 for address ROMA 220A, assuming it is handling four even address bits (A0, A2, A4, A6) that are provided to detection logic 222A. Address ROMB 220B could be implemented with similar circuitry for the additional address bits, such as for example odd address bits (A1, A3, A5) in a seven bit address.

Looking to FIG. 3, address ROM 220A has, in this example, 128 word lines of which four are shown, WL0, WL1, WL126, and WL127. Crossing the word lines are bit lines 23, 25, 27, 29, 31, 33, 35, and 37 also identified as address A0, address A0B, address A2, address A2B, address A4, address A4B, address A6, and address A6B. The "B" indications represent a bit that is the complement, such that if AN is a first logic level ANB is the complimentary logic level. Bit lines may also be referenced by their address identifier. For example bit line 23 may be referenced as bit line A0. On the word line WL0, WL1, WL126, and WL127 are N channel transistors functioning as a ROM. N channel transistors 24, 26, 28, and 30 have their gates connected to word line WL0, their sources connected to ground, and their drains connected to bit lines A0B, A2B, A4B, and A6B, respectively. N channel transistors 34, 36, 38, and 40 have their gates connected to word line WL1, their sources connected to ground, and their drains connected to bit lines A0B, A2B, A4B, and A6, respectively. N channel transistors 46, 48, 50, and 52 have their gates connected to word line WL126, their sources connected to ground, and their drains connected to bit lines A0, A2, A4, and A6B, respectively. N channel transistors 56, 58, 60, and 62 have their gates connected to word line WL127, their sources connected to ground, and their drains connected to bit lines A0, A2, A4, and A6, respectively. Half latches 64, 66, 68, 70, 72, 74, 76, and 78 are connected to bit lines A0, A0B, A2, A2B, A4, A4B, A6, A6B, respectively. These half latches each include a P channel transistor having a source connected to a positive power supply terminal and a drain connected to the bit line to which the latch is connected and an inverter having an input connected to the bit line to which the latch is connected and an output connected to the detection logic 222A. These latches function to keep a pre-charge voltage on the bit lines at the positive power supply voltage until one of the N channel transistors connected to the bit line becomes conductive to reduce the bit line voltage to ground. P channel transistors 82, 84, 86, 88, 90, 92, 94, and 96 are connected to bit lines A0, A0B, A2, A2B, A4, A4B, A6, and A6B, respectively, and operate to pre-charge the bit lines to which they are connected in response to a pre-charge signal PCHB.

For wordline operation during a memory access for embodiment 300 where no faults occur, only one of the wordlines (e.g., one of the 128 wordlines from wordline WL0 to WL 127 for embodiment 300) is selected and driven high by the wordline driver(s) based upon the wordline address (e.g., 7-bit wordline address). For embodiment 300, the split address ROM is configured such that the true bit lines A0-A6 and the complementary (i.e., not true) bit lines A0B-A6B are pre-charged high and then pulled low by N channel transistors connected to the selected wordline. These bit lines represent the wordline address. Further, the N channel transistors within the address ROMs 220A/B have fixed connections to these bit lines such that each selected wordline will produce a unique set of outputs from the address ROMs 220A/B. As such, the address ROMs 220A/B in effect operate as read-only-memories that output fixed data bits based upon the selected wordline, and these data bits are the address ROM outputs RA0-RA6 (true bits) and RA0B-RA6B (not true bits).

For example, if the 7-bit wordline address is 0000001, then the $1^{st}$ wordline (WL1) should be driven high. Assuming this active wordline WL1 properly reaches the address ROM 220A, the even ROM bit lines A0-A2-A4 remain at the high pre-charge level; the even ROM bit line A6 is pulled low; the even ROM complimentary bit lines A0B-A2B-A4B are pulled low; and the even ROM complimentary bit line A6B remains at the high pre-charge level. The half latches 64, 66, 68, 70, 72, 74, 76, and 78 operate to invert these logic levels so that the even ROM outputs RA0-RA2-RA4-RA6 are 0-0-0-1, and the complimentary ROM outputs RA0B-RA2B-RA4B-RA6B are 1-1-1-0. As such, if the addressing for the array 218A is operating properly, the even ROM outputs RA0-RA2-RA4-RA6 should match the even bits of the wordline address. Further, if the addressing for array 218A is operating properly, the true ROM outputs RA0-RA2-RA4-RA6 should not match the not true ROM outputs RA0B-RA2B-RA4B-RA6B. The other side of the split array 218B and the address ROM 220B operate in a similar fashion to produce odd ROM outputs RA1-RA3-RA5 and RA1B-RA3B-RA5B.

As another example, if the 7-bit wordline address is 1111110, then the $126^{th}$ wordline (WL126) should be driven high. Assuming this active wordline reaches the address ROM 220A, the even ROM bit lines A0-A2-A4 are pulled low; the even ROM bit line A6 remains at the high pre-charge level; the even ROM complimentary bit lines A0B-A2B-A4B remain at the high pre-charge level; and the even ROM complimentary bit line A6B is pulled low. The half latches 64, 66, 68, 70, 72, 74, 76, and 78 operate to invert these logic levels so that the even ROM outputs RA0-RA2-RA4-RA6 are 1-1-1-0, and the complimentary ROM outputs A0B-A2B-A4B-A6B are 0-0-0-1. As above, if the addressing for the array 218A is operating properly, the even ROM outputs RA0-RA2-RA4-RA6 should match the even bits of the wordline address. Further, if the addressing for array 218A is operating properly, the true ROM outputs RA0-RA2-RA4-RA6 should not match the not true ROM outputs RA0B-RA2B-RA4B-RA6B. The other side of the split array 218B and the address ROM 220B operate in a similar fashion to produce odd ROM outputs RA1-RA3-RA5 and RA1B-RA3B-RA5B.

Thus, if the wordline addressing is working properly without address errors or wordline continuity errors across the array, then the wordline address should match the true ROM outputs, and the true and compliment (i.e., not true) ROM outputs should not match each other. If the wordline address does not match the ROM outputs, or if the true and not true ROM outputs do match, then a wordline address fault is deemed to have occurred. Wordline address faults can be caused, for example, by wordline address errors, wordline selection errors, wordline driver errors, wordline continuity errors, and/or other wordline addressing related errors that cause fault conditions to be detected.

The detection logic 222A/B is used to make these wordline fault determinations. Looking back to the address ROM 220A for the even bits, detection logic 222A receives ROM output signals RA0, RA0B, RA2, RA2B, RA4, RA4B, RA6, and RA6B from the address ROMA 220A. These ROM output signals are at a high logic level if the corresponding bit line A0, A0B, A2, A2B, A4, A4B, A6, and A6B is driven low by one of the wordlines. The detection logic 222A also receives a portion of the wordline address that correlates to the address bits being handled by address ROMA 220A. For the example depicted where address ROMA 220A is handling even address bits (A0, A2, A4, A6), these wordline address bits will be the corresponding four even bits of the input address (ADDR0, ADDR2, ADDR4, ADDR6). As described in more detail below, the detection logic 222A operates to determine whether address faults have occurred and outputs the address fault indicator (FAULT). It is noted that detection logic 222B would operate in a similar way with respect to address ROMB 220B to receive the odd ROM output signals RA1, RA1B, RA3, RA3B, RA5, and RA5B where address ROMB 220B is configured to handle odd address bits A1, A3, A5. The detection logic 222B would similarly operate to determine whether address faults have occurred and to output an address fault indicator (FAULT). As described herein, the fault indicators from detection logic blocks 222A/222B could be combined to form a single fault indicator, if desired.

Figure 4:
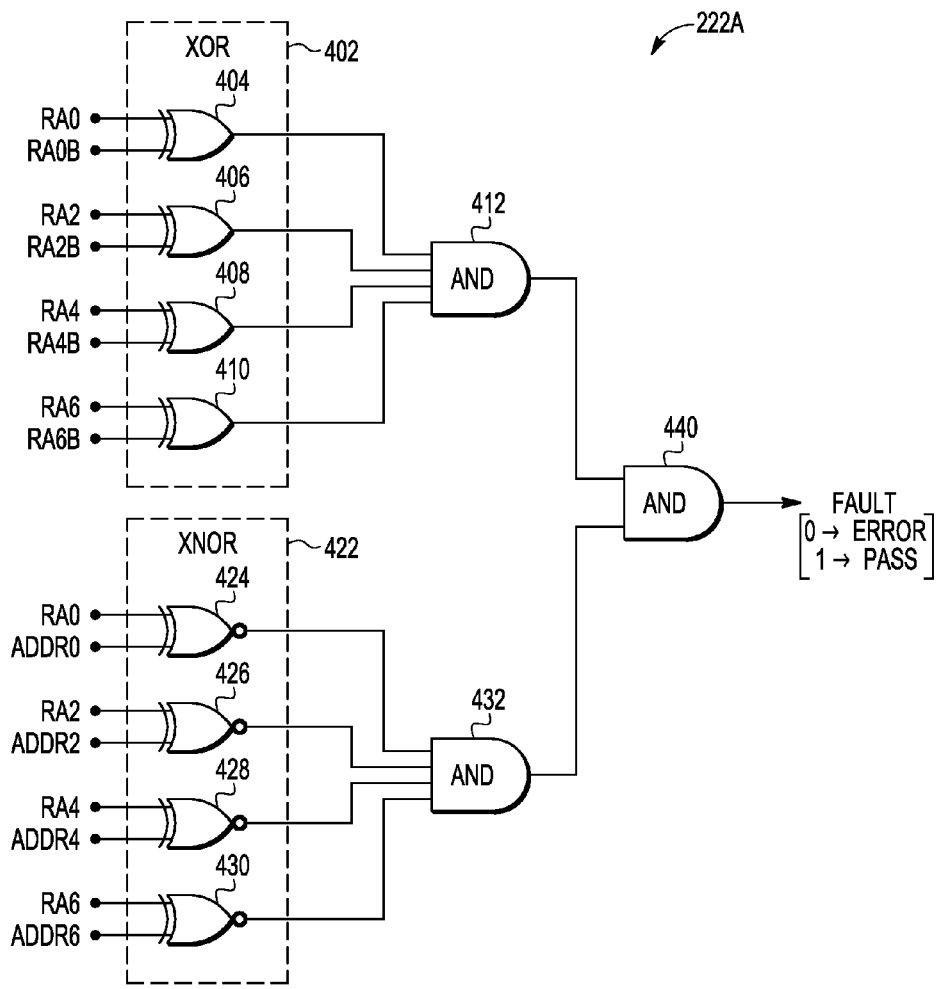
FIG. 4 is a circuit diagram of an example embodiment for detection logic.

FIG. 4 is a circuit diagram of an example embodiment for detection logic 222A. Block 402 includes exclusive-OR (XOR) logic circuits that receive the true and bar (i.e. not true) ROM output signals for each ROM address handled by the address ROMA 220A. Block 422 includes inverted-exclusive-OR (XNOR) logic circuits that receive the true ROM output signals for each ROM address handled by the address ROMA 220A, as well as the original addresses. For the example embodiment depicted, four addresses are again handled by the address ROMA 220A.

Looking to block 402, XOR block 404 receives ROM output signals RA0 and RA0B; XOR block 406 receives ROM output signals RA2 and RA2B; XOR block 408 receives ROM output signals RA4 and RA4B; and XOR block 410 receives ROM output signals RA6 and RA6B. As XOR logic circuits, blocks 404/406/408/410 will output a logic zero if their inputs match and a logic one if their inputs do not match. Because the true and bar address signals should not match for proper operation, a logic zero will be output if a fault has occurred. The outputs of the XOR logic circuits 404/406/408/410 are then provided to an AND gate 412 that will also output a logic zero if any of the XOR logic circuits 404/406/408/410 output a logic zero indicating a fault has occurred.

Looking to block 422, XNOR block 424 receives ROM output signal RA0 and address signal ADDR0; XNOR block 426 receives ROM output signal RA2 and address signal ADDR2; XNOR block 428 receives ROM output signal RA4 and address signal ADDR4; and XNOR block 430 receives ROM output signals RA6 and address signal ADDR6. As XNOR logic circuits, blocks 424/426/428/430 will output a logic zero if their inputs do not match and a logic one if their inputs match. Because the true ROM output signals and the input address signals should match for proper operation, a logic zero will be output if a fault has occurred. The outputs of the XNOR logic circuits 424/426/428/430 are then provided to an AND gate 432 that will also output a logic zero if any of the XNOR logic circuits 424/426/428/430 output a logic zero indicating a fault has occurred.

For the embodiment depicted, the outputs from AND gates 412 and 432 are provided to AND gate 440 to provide a combined fault output signal (FAULT). The AND gate 440 will output a logic one only if all of the outputs from the XOR block 402 and the XNOR block 422 are a logic one. A logic one indicates a PASS in that no address faults were detected. The AND gate 440 will output a logic zero if any one of the outputs from the XOR block 402 or the XNOR block 422 is a logic zero. A logic zero indicates an ERROR in that at least one address fault was detected.

It is noted that detection logic 222B can be implemented similar to the circuitry for detection logic 222A in FIG. 4. Following the example embodiments above, the odd addresses (A1, A3, A5) would be handled, and the output from detection logic 222B would be logic zero if an address fault had been detected and a logic one if no address fault had been detected. It is further noted that the fault indicator signal from detection logic 222B could be combined with the fault indicator signal from detection logic 222A to form a single fault indicator signal from the memory system. For example, additional AND gates and/or other logic circuitry could be used after AND gate 440 to receive and logically combine the fault indicator signals into a single fault indicator signal. For example, one or more AND gates could be used such that any logic "0" within the received fault indicators will cause a logic "0" to be output as the combined fault indicator to indicate that a fault has occurred. A no fault condition (i.e., PASS) would then occur only if all logic "1 s" were received within the fault indicators so that the combined fault indicator would also be a logic "1." Other and/or different logic could also be utilized, if desired.

While the embodiments of FIGS. 2-4 have described the address fault detection using split address ROMs with respect to wordline addresses, additional address ROMs and associated outputs can also be used to detect block address failures and/or column address failures. As such, ROM outputs can be used to check the whole address space for faults rather than just being used to check the wordline addresses. For such an implementation, it is further noted that the true and bar (i.e., not true) outputs from each block for wordline addresses, column addresses, and/or block addresses can be coupled to n-channel pulldown transistors on a common metal line to generate a global ROM output that feeds into detection logic used to determine if address faults have occurred within the whole address space.

Figure 5:
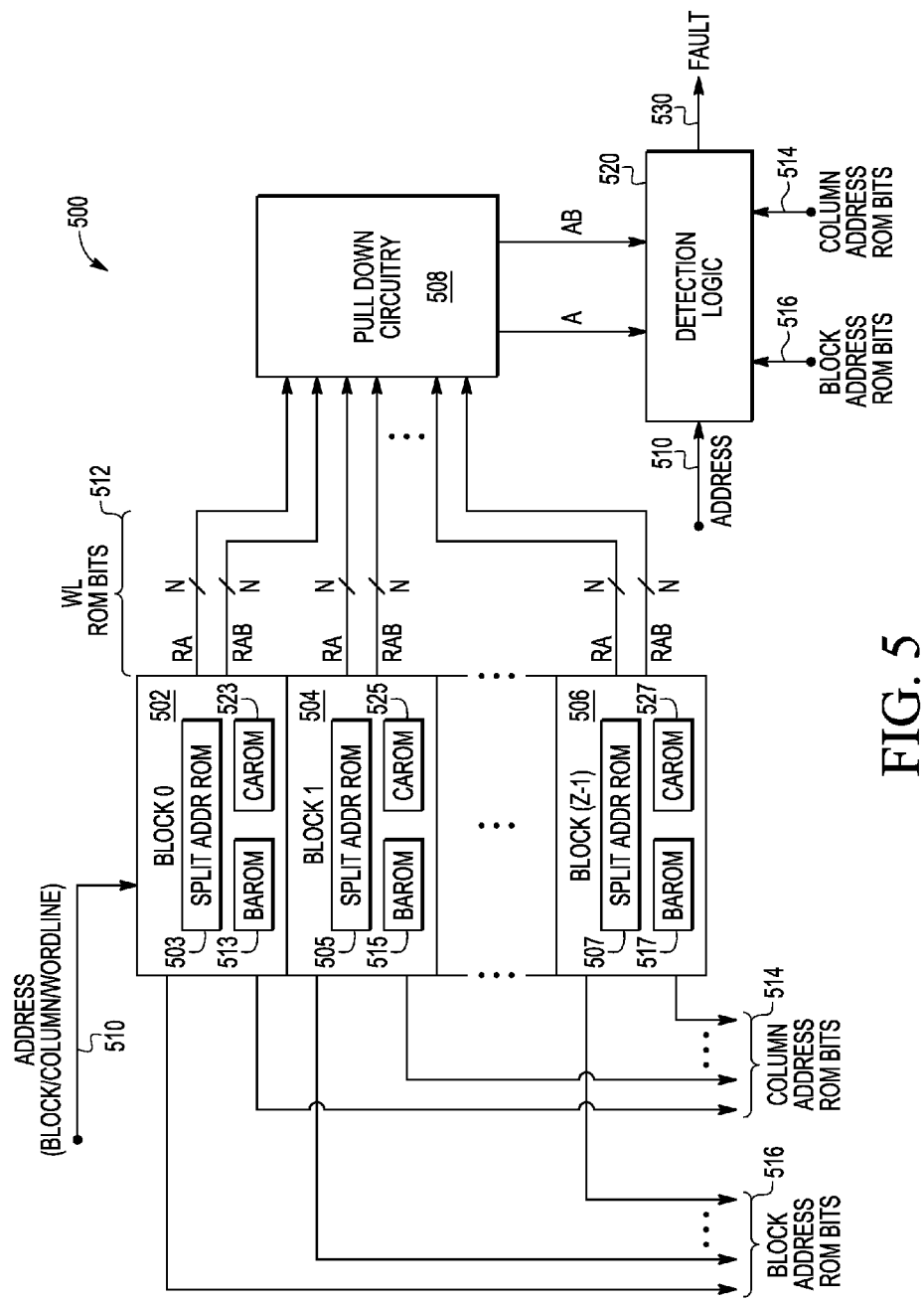
FIG. 5 is a block diagram of an example embodiment where address ROM outputs from multiple sub-array memory blocks are combined prior to being processed by detection logic.

FIG. 5 is a block diagram of an example embodiment 500 where ROM outputs from multiple memory blocks are combined prior to being processed by detection logic. For the example embodiment depicted, a memory array includes Z separate blocks and receives address 510. The address 510 includes block address bits, column address bits, and wordline address bits that are used to select memory cells within the memory array. Each of the blocks 502, 504 . . . 506 (BLOCK0, BLOCK1 . . . BLOCK(Z−1)) includes a split address ROM 503, 505 . . . 507, respectively. As described herein, the split address ROMs 503, 505 . . . 507 operate to output a set of true and bar ROM outputs (RA, RAB) associated with an N-bit wordline address to provide the wordline (WL) ROM bits 512. For embodiment 500, the wordline (WL) ROM bits are then provided to pull-down circuitry 508. The pull-down logic circuitry 508 then outputs a combined set of true and bar ROM output signals (A, AB) to the detection logic 520. As described with respect to the embodiments above, detection logic 520 also receives the wordline input address, which is included within the address 510 for embodiment 500, and performs logic operations to detect wordline address faults. It is noted that only one block is typically active at a time.

As indicated above, the entire address 510 received by the memory array can include wordline address bits for selection of wordlines, column address bits for selection of a columns, and block address bits for selection of blocks. Further, the entire address 510 can be checked for address faults using additional address ROMs associated with blocks 502, 504 . . . 506 (BLOCK0, BLOCK1 . . . BLOCK(Z−1)), and these additional address ROMs can be configured to the wordline address ROMs described herein. For example, block related address ROM bits 516 from block address ROMs (BAROMs) 513, 515 . . . 517 can also be used with respect to the blocks 502, 504 . . . 506 (BLOCK0, BLOCK1 . . . BLOCK(Z−1)) to determine block address faults. Similarly, column related address ROM bits 514 from column address ROMs (CAROMs) 523, 525 . . . 527 can also be used with respect to blocks 502, 504 . . . 506 (BLOCK0, BLOCK1 . . . BLOCK(Z−1)) to determine column address faults. The column address ROM bits 514 and the block address ROM bits 516 from these additional address ROMs within the blocks 502, 504 . . . 506 (BLOCK0, BLOCK1 . . . BLOCK(Z−1)) are also provided to detection logic 520, which performs logic operations to detect block and column address faults in addition to the wordline address faults described above. Block fault indicators can be logically combined to form a single block fault indicator, and column fault indicators can be logically combined to form a single column fault indicator. Further, the block fault indicator and column fault indicator can further be logically combined with the wordline fault indicator to form an overall array address fault indicator. As such, a single fault indicator 530 can be provided for the whole address space.

As described herein, a variety of embodiments can be implemented and different features and variations can be implemented, as desired.

For one disclosed embodiment, a memory system having address fault detection includes at least two separate arrays of memory cells having a plurality of wordlines, at least two separate address ROMs (read only memories) with each address ROM being associated with a different one of the at least two separate arrays of memory cells and being configured to provide outputs based upon only a portion of a wordline address used to select one of the wordlines, and detection logic coupled to the outputs of the address ROMs and configured to provide at least one fault indicator output to indicate when at least one address fault associated with the wordline address has occurred. In further embodiments, the separate arrays include a first array of memory cells and a second array of memory cells, and the separate address ROMs include a first address ROM associated with the first array of memory cells and a second address ROM associated with the second array of memory cells.

In other embodiments, the memory system also includes an address decoder configured to receive a wordline address and to select a wordline for the first and second arrays using the wordline address and at least one wordline driver coupled to the address decoder and configured to activate the selected wordline within the first and second arrays. Further, the first address ROM can be located on an opposite side of the first array from the at least one wordline driver, and the second address ROM can be located on an opposite side of the second array from the at least one wordline driver, such that the at least one fault indicator also provides an indication of wordline continuity faults. In addition, the outputs of the first address ROM can be based upon M bits of an N-bit wordline address, and the outputs of second address ROM can be based upon N-M bits of an N-bit wordline address. Still further, the M bits of the N-bit wordline address for the first address ROM can be even bits of the N-bit wordline address, and the N-M bits of the N-bit wordline address for the N-bit wordline address can be odd bits for the N-bit wordline address.

In still other embodiments, the detection logic can include first detection logic configured to detect address faults based upon the outputs from the first address ROM and second detection logic configured to detect address faults based upon the outputs from the second address ROM. Further, the first detection logic can be configured to detect address faults based upon a comparison of the outputs from the first address ROM and the M bits of the N-bit wordline address, and the second detection logic can be configured to detect address faults based upon a comparison of the outputs from the second address ROM and the N-M bits of the N-bit wordline address. In addition, the outputs from the first and second address ROMs can include true and not true outputs, and the first detection logic and the second detection logic can each be configured to detect address faults based upon a comparison of the true and not true outputs. Still further, a first fault indicator output from the first detection logic and a second fault indicator output from the second detection logic can be combined to form a combined fault indicator output.

In further embodiments, the separate arrays of memory cells and the separate address ROMs can be within a first memory block, and the system can further include at least one additional memory block. Each additional memory block also includes at least two separate arrays of memory cells having a plurality of wordlines, and at least two separate address ROMs with each address ROM being associated with a different one of the at least two separate arrays of memory cells and being configured to provide outputs based upon only a portion of a wordline address used to select one of the wordlines. And outputs of the address ROMs are combined to form combined outputs that are coupled to the detection logic. In addition, the system can also include at least one additional address ROM within each memory block associated with a column address, and the detection logic can be further configured to receive outputs from the additional column address ROMs and to provide at least one fault indicator output to indicate when at least one address fault associated with the column address has occurred. Still further, the system can also include at least one additional address ROM within each memory block associated with a block address, and the detection logic can be further configured to receive outputs from the additional block address ROMs and to provide at least one fault indicator output when at least one address fault associated with the block address has occurred.

For another disclosed embodiment, a method for detecting address faults within a memory system includes receiving a wordline address for a memory system including at least two separate arrays of memory cells having a plurality of wordlines, using at least two separate address ROMs (read only memories) to provide outputs based upon only a portion of the wordline address, each address ROM being associated with a different one of the at least two separate arrays of memory cells, and providing at least one fault indicator output based upon the outputs of the address ROMs to indicate when at least one address fault associated with the wordline address has occurred.

In other embodiments, the method also includes driving a wordline within each of the separate address ROMs using at least one wordline driver coupled to an address decoder coupled to receive the wordline address. Further, at least one address ROM can be located on an opposite side of each separate address array from the at least one wordline driver. In addition, the method can include using outputs from the address ROMs to detect wordline continuity faults within the separate arrays of memory cells.

In further embodiments, the separate arrays include a first array of memory cells and a second array of memory cells, and the separate address ROMs include a first address ROM associated with the first array of memory cells and a second address ROM associated with the second array of memory cells. In addition, the outputs of the first address ROM can be based upon M bits of an N-bit wordline address, and the outputs of second address ROM can be based upon N-M bits of the N-bit wordline address. Still further, the providing step can include comparing outputs from the first address ROM and the M bits of the N-bit wordline address and comparing the outputs from the second address ROM and the N-M bits of the N-bit wordline address. In addition, the providing step can include comparing true and not true outputs from the first address ROM and comparing true and not true outputs from the second address ROM.

In still further embodiments, the method can also include using at least one additional address ROM to provide outputs associated with a column address, using at least one additional address ROM to provide outputs associated with a block address, and providing at least one fault indicator output based upon the outputs from the additional ROMs when at least one address fault associated with the column address or the block address has occurred.

It is further noted that the functional blocks described herein can be implemented using hardware, software, or a combination of hardware and software, as desired. In addition, one or more processors running software and/or firmware can also be used, as desired, to implement the disclosed embodiments. It is further understood that one or more of the operations, tasks, functions, or methodologies described herein may be implemented, for example, as software or firmware and/or other program instructions that are embodied in one or more non-transitory tangible computer readable mediums (e.g., memory) and that are executed by one or more controllers, microcontrollers, microprocessors, hardware accelerators, and/or other processors to perform the operations and functions described herein.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A memory system having address fault detection, comprising:
   at least two separate arrays of memory cells having a plurality of wordlines, the at least two separate arrays comprising a first array of memory cells and a second array of memory cells;
   at least two separate address ROMs (read only memories), each address ROM being associated with a different one of the at least two separate arrays of memory cells and being configured to provide outputs based upon only a portion of a wordline address used to select one of the wordlines, the at least two separate address ROMs comprising a first address ROM associated with the first array of memory cells and a second address ROM associated with the second array of memory cells;
   detection logic coupled to the outputs of the address ROMs and configured to provide at least one fault indicator output to indicate when at least one address fault associated with the wordline address has occurred;
   an address decoder configured to receive a wordline address and to select a wordline for the first and second arrays using the wordline address; and
   at least one wordline driver coupled to the address decoder and configured to activate the selected wordline within the first and second arrays;
   wherein the outputs of the first address ROM are based upon M bits of an N-bit wordline address and wherein the outputs of second address ROM are based upon N-M bits of an N-bit wordline address.

2. The memory system of claim 1, wherein the first address ROM is located on an opposite side of the first array from the at least one wordline driver, and wherein the second address ROM is located on an opposite side of the second array from the at least one wordline driver, such that the at least one fault indicator also provides an indication of wordline continuity faults.

3. The memory system of claim 1, wherein the M bits of the N-bit wordline address for the first address ROM are even bits of the N-bit wordline address, and wherein the N-M bits of the N-bit wordline address for the N-bit wordline address are odd bits for the N-bit wordline address.

4. The memory system of claim 1, wherein the detection logic comprises first detection logic configured to detect address faults based upon the outputs from the first address ROM and second detection logic configured to detect address faults based upon the outputs from the second address ROM.

5. The memory system of claim 4, wherein the first detection logic is configured to detect address faults based upon a comparison of the outputs from the first address ROM and the M bits of the N-bit wordline address, and wherein the second detection logic is configured to detect address faults based upon a comparison of the outputs from the second address ROM and the N-M bits of the N-bit wordline address.

6. The memory system of claim 4, wherein the outputs from the first and second address ROMs comprise true and not true outputs and wherein the first detection logic and the second detection logic are each configured to detect address faults based upon a comparison of the true and not true outputs.

7. The memory system of claim 4, wherein a first fault indicator output from the first detection logic and a second fault indicator output from the second detection logic are combined to form a combined fault indicator output.

8. The memory system of claim 1, wherein the at least two separate arrays of memory cells and the at least two separate address ROMs are within a first memory block, and further comprising at least one additional memory block also comprising:
   at least two separate arrays of memory cells having a plurality of wordlines; and
   at least two separate address ROMs, each address ROM being associated with a different one of the at least two separate arrays of memory cells and being configured to provide outputs based upon only a portion of a wordline address used to select one of the wordlines;
   wherein outputs of the address ROMs are combined to form combined outputs that are coupled to the detection logic.

9. The memory system of claim 8, further comprising at least one additional address ROM within each memory block associated with a column address, and wherein the detection logic is further configured to receive outputs from the additional column address ROMs and to provide at least one fault indicator output to indicate when at least one address fault associated with the column address has occurred.

10. The memory system of claim 9, further comprising at least one additional address ROM within each memory block associated with a block address, and wherein the detection logic is further configured to receive outputs from the additional block address ROMs and to provide at least one fault indicator output when at least one address fault associated with the block address has occurred.

11. A method for detecting address faults within a memory system, comprising:
   receiving a wordline address for a memory system including at least two separate arrays of memory cells having a plurality of wordlines, the at least two separate arrays comprising a first array of memory cells and a second array of memory cells;
   using at least two separate address ROMs (read only memories) to provide outputs based upon only a portion of the wordline address, each address ROM being associated with a different one of the at least two separate arrays of memory cells, the at least two separate address ROMs comprising a first address ROM associated with the first array of memory cells and a second address ROM associated with the second array of memory cells; and
   providing at least one fault indicator output based upon the outputs of the address ROMs to indicate when at least one address fault associated with the wordline address has occurred;
   wherein the outputs of the first address ROM are based upon M bits of an N-bit wordline address and wherein the outputs of second address ROM are based upon N-M bits of the N-bit wordline address.

12. The method of claim 11, further comprising driving a wordline within each of the separate address ROMs using at least one wordline driver coupled to an address decoder coupled to receive the wordline address.

13. The method of claim 12, wherein at least one address ROM is located on an opposite side of each separate address array from the at least one wordline driver.

14. The method of claim 13, further comprising using outputs from the address ROMs to detect wordline continuity faults within the separate arrays of memory cells.

15. The method of claim 11, wherein the providing step comprises comparing outputs from the first address ROM and the M bits of the N-bit wordline address and comparing the outputs from the second address ROM and the N-M bits of the N-bit wordline address.

16. The method of claim 11, wherein the providing step comprises comparing true and not true outputs from the first address ROM and comparing true and not true outputs from the second address ROM.

17. The method of claim 11, further comprising using at least one additional address ROM to provide outputs associated with a column address, using at least one additional address ROM to provide outputs associated with a block address, and providing at least one fault indicator output based upon the outputs from the additional ROMs when at least one address fault associated with the column address or the block address has occurred.

* * * * *